(12) United States Patent
Birner et al.

(10) Patent No.: US 10,026,806 B2
(45) Date of Patent: Jul. 17, 2018

(54) SEMICONDUCTOR DEVICE INCLUDING AN LDMOS TRANSISTOR AND A RESURF STRUCTURE

(71) Applicant: Infineon Technologies AG, Neubiberg (DE)

(72) Inventors: Albert Birner, Regensburg (DE); Helmut Brech, Lappersdorf (DE); Matthias Zigldrum, Regensburg (DE); Michaela Braun, Regensburg (DE); Christian Eckl, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/458,492

(22) Filed: Mar. 14, 2017

(65) Prior Publication Data

US 2017/0373138 A1    Dec. 28, 2017

Related U.S. Application Data

(63) Continuation of application No. 15/191,854, filed on Jun. 24, 2016.

(51) Int. Cl.
*H01L 29/66* (2006.01)
*H01L 29/06* (2006.01)
(Continued)

(52) U.S. Cl.
CPC ...... *H01L 29/063* (2013.01); *H01L 21/76898* (2013.01); *H01L 29/402* (2013.01);
(Continued)

(58) Field of Classification Search
CPC . H01L 29/063; H01L 29/402; H01L 29/7823; H01L 21/76898; H01L 29/7816;
(Continued)

(56) References Cited

U.S. PATENT DOCUMENTS 5,252,848 A    10/1993   Adler et al.
6,048,772 A    4/2000    D'Anna
(Continued)

FOREIGN PATENT DOCUMENTS

DE           10348641 A1     5/2005

OTHER PUBLICATIONS

Sunitha, et al., "Reduced Surface Field Technology for LDMOS: A Review", International Journal of Emerging Technology and Advanced Engineering, vol. 4, Issue 6, Jun. 2014, pp. 173-176.

*Primary Examiner* — Yosef Gebreyesus
(74) *Attorney, Agent, or Firm* — Murphy, Bilak & Homiller, PLLC (57) ABSTRACT

In an embodiment, a high frequency amplifying circuit includes a semiconductor device. The semiconductor device includes a semiconductor substrate having a bulk resistivity $\rho \geq 100$ Ohm·cm, a front surface and a rear surface, an LDMOS (Lateral Diffused Metal Oxide Semiconductor) transistor in the semiconductor substrate, and a RESURF structure comprising a doped buried layer arranged in the semiconductor substrate, spaced at a distance from the front surface and the rear surface, and coupled with at least one of a channel region and a body contact region of the LDMOS transistor.

25 Claims, 7 Drawing Sheets

(51) Int. Cl.
 *H01L 21/768* (2006.01)
 *H03F 3/193* (2006.01)
 *H03F 1/02* (2006.01)
 *H01L 29/78* (2006.01)
 *H01L 29/40* (2006.01)

(52) U.S. Cl.
 CPC ....... *H01L 29/7823* (2013.01); *H03F 1/0288* (2013.01); *H03F 3/193* (2013.01); *H03F 2200/451* (2013.01)

(58) Field of Classification Search
 CPC ........... H01L 29/66681; H01L 29/1095; H01L 23/5283; H01L 21/26513; H01L 21/76877; H03F 2200/451
 See application file for complete search history.

(56) References Cited

U.S. PATENT DOCUMENTS

| | | | |
|---|---|---|---|
| 7,119,399 B2 | 10/2006 | Ma et al. | |
| 7,221,034 B2 | 5/2007 | Ma et al. | |
| 7,253,492 B2 | 8/2007 | Ma et al. | |
| 7,456,094 B2 | 11/2008 | Ma et al. | |
| 7,626,233 B2 | 12/2009 | Tornblad et al. | |
| 7,772,123 B2 | 8/2010 | Birner et al. | |
| 8,227,340 B2 | 7/2012 | Seidel et al. | |
| 8,399,936 B2 | 3/2013 | Birner et al. | |
| 8,518,764 B2 | 8/2013 | Dao et al. | |
| 8,680,615 B2 | 3/2014 | Mitra et al. | |
| 8,716,791 B1* | 5/2014 | Iravani | H01L 29/66681 257/339 |
| 8,890,324 B2 | 11/2014 | Dao | |
| 9,064,712 B2 | 6/2015 | Sanders et al. | |
| 9,165,918 B1 | 10/2015 | Yang et al. | |
| 9,245,952 B2 | 1/2016 | Yao et al. | |
| 2002/0038891 A1 | 4/2002 | Ryu et al. | |
| 2004/0229456 A1 | 11/2004 | Andricacos et al. | |
| 2006/0046350 A1 | 3/2006 | Jiang et al. | |
| 2006/0183317 A1 | 8/2006 | Noguchi et al. | |
| 2006/0289924 A1 | 12/2006 | Wang et al. | |
| 2008/0093641 A1* | 4/2008 | Ludikhuize | H01L 29/0634 257/289 |
| 2008/0119007 A1 | 5/2008 | Raghuram et al. | |
| 2008/0166849 A1* | 7/2008 | Yang | H01L 29/0847 438/305 |
| 2009/0026539 A1* | 1/2009 | Birner | H01L 29/0653 257/336 |
| 2009/0294849 A1 | 12/2009 | Min et al. | |
| 2009/0302480 A1 | 12/2009 | Birner et al. | |
| 2010/0022084 A1 | 1/2010 | Chen et al. | |
| 2010/0032756 A1 | 2/2010 | Pendharkar et al. | |
| 2010/0230818 A1 | 9/2010 | Birner et al. | |
| 2010/0295154 A1 | 11/2010 | Riess | |
| 2011/0074040 A1 | 3/2011 | Frank et al. | |
| 2011/0101425 A1 | 5/2011 | Grote et al. | |
| 2011/0309442 A1 | 12/2011 | Grote et al. | |
| 2012/0037969 A1 | 2/2012 | Sanders et al. | |
| 2012/0061758 A1 | 3/2012 | Khan et al. | |
| 2012/0061798 A1 | 3/2012 | Wong et al. | |
| 2013/0119547 A1 | 5/2013 | Kim et al. | |
| 2014/0225186 A1 | 8/2014 | Abou-Khalil et al. | |
| 2014/0264896 A1 | 9/2014 | Lu et al. | |
| 2015/0243583 A1 | 8/2015 | Li et al. | |
| 2015/0251382 A1 | 9/2015 | Terasaki et al. | |
| 2015/0294898 A1 | 10/2015 | Yamaguchi | |
| 2016/0141362 A1 | 5/2016 | Gogoi | |

\* cited by examiner

SEMICONDUCTOR DEVICE INCLUDING AN LDMOS TRANSISTOR AND A RESURF STRUCTURE

BACKGROUND

There is an ongoing need for solid state circuits adapted to operate at higher and higher frequencies, including microwave frequencies. As used herein, the term "microwave" is intended to refer to frequencies at or above about 300 MHz, for example between 300 MHz and 3 GHz. Various transistor structures have been created that are capable of providing gain in such frequency ranges. A LDMOS (Lateral Diffused Metal Oxide Semiconductor) transistor is an example of such a transistor structure.

For power amplifier circuits with a faster switching speeds, LDMOS transistors with a high breakdown voltage and low on-resistance are desirable. However, these parameters are influenced in an opposing manner. For example by increasing the drift length, the breakdown voltage is improved but the on-resistance is increased.

Therefore, further improvements to provide transistor devices with improved performance at higher frequencies are desirable.

SUMMARY

In an embodiment, a semiconductor device includes a semiconductor substrate having a bulk resistivity $\rho \geq 100$ Ohm·cm, a front surface and a rear surface, at least one LDMOS transistor in the semiconductor substrate, and a RESURF structure. The RESURF structure includes a doped buried layer arranged in the semiconductor substrate, spaced at a distance from the front surface and the rear surface and coupled with at least one of a channel region and a body contact region of the LDMOS transistor.

In an embodiment, a semiconductor device includes a semiconductor substrate having a bulk resistivity $\rho \geq 100$ Ohm·cm, a front surface and a rear surface, at least one LDMOS transistor in the semiconductor substrate, the LDMOS transistor including a source region, a drain region, a channel region, a drift region and a body contact region, wherein the source region is coupled to a conductive layer on the rear surface of the substrate, a doped buried layer arranged in the substrate, spaced at a distance from the front surface and the rear surface and coupled with the body contact region of the LDMOS transistor, a gate shield extending from a gate towards a source region of the LDMOS transistor, and a field plate extending from a gate towards a drain region of the LDMOS transistor.

In an embodiment, a method includes implanting a self-depleting layer with a dopant concentration of a first conductivity type within a semiconductor substrate having a bulk resistivity $\rho \geq 100$ Ohm·cm and forming an LDMOS transistor in a front surface of the substrate, such that a source region, a channel region, a drift region and a drain region are spaced apart from the self-depleting layer by a portion of the substrate, wherein the body contact region extends to and is coupled with the self-depleting layer.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

It will be understood by those of skill in the art that the active device(s), such as a LDMOS transistor, may be formed on or over the substrate or entirely within the substrate or partly within and partly on or over the substrate, depending upon the nature of the device(s). Accordingly, as used herein with respect to the active device(s), the terms "in the substrate", "in the semiconductor substrate" and equivalents are intended to include all such variations.

Figure 1:
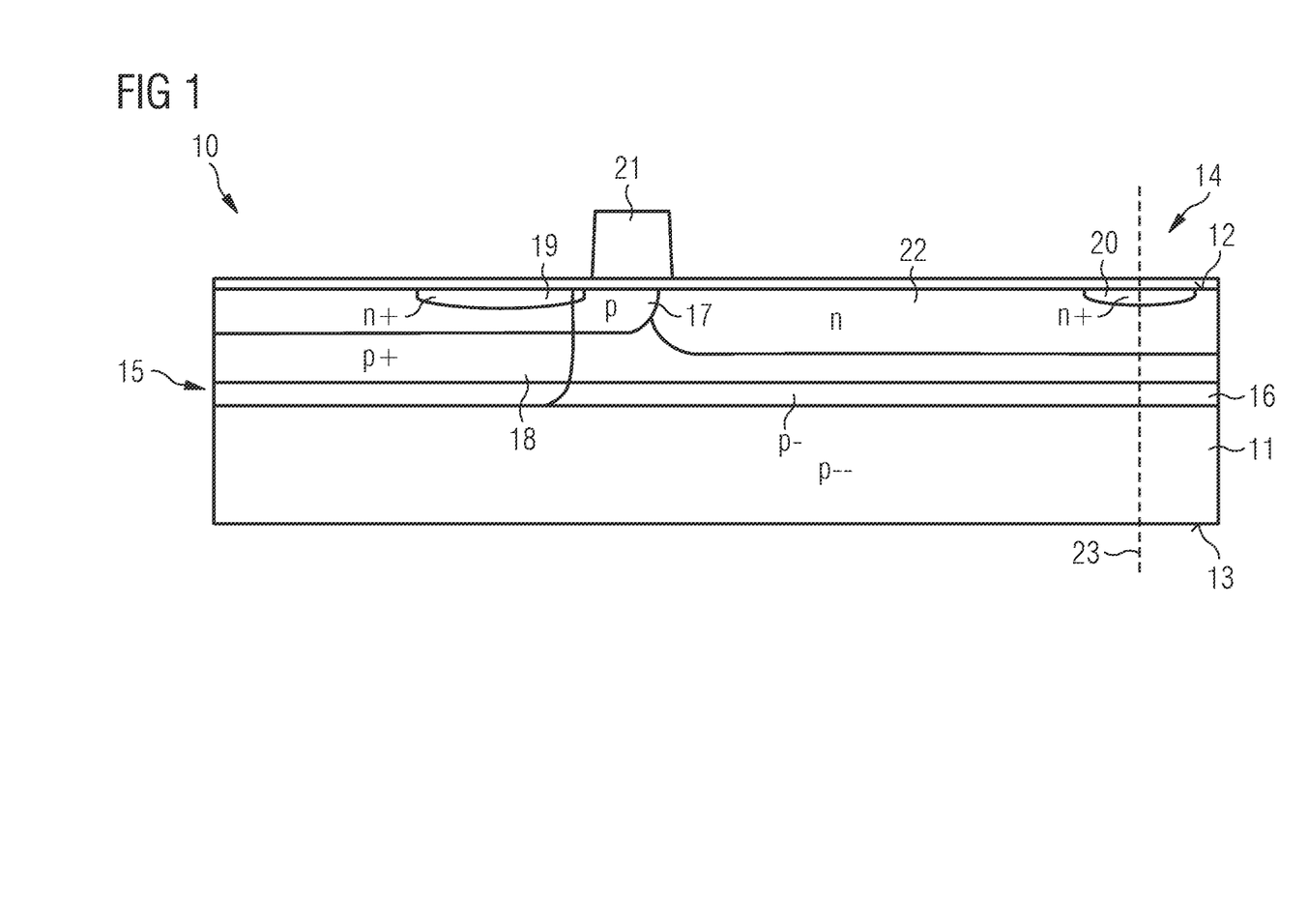
FIG. 1 illustrates a semiconductor device including a LDMOS transistor having a RESURF structure.

FIG. 1 illustrates a semiconductor device 10 according to an embodiment. The semiconductor device 10 includes a semiconductor substrate 11 having a front surface 12 and a rear surface 13. The semiconductor substrate 11 has a bulk resistivity, ρ, which is greater or equal to 100 Ohm·cm. The semiconductor device 10 includes at least one LDMOS (Laterally Diffused Metal Oxide Semiconductor) transistor 14 in the semiconductor substrate 11. The semiconductor device 10 further includes a RESURF structure 15 which includes a doped buried layer 16 arranged in the semiconductor substrate 11. The doped buried layer 16 is spaced at a distance from the front surface 12 and is spaced at a distance from the rear surface 13 of the semiconductor substrate 11. The doped buried layer 16 is coupled with a channel region 17 and/or a body contact region 18 of the LDMOS transistor 14.

A RESURF structure 15 (REduced SURface Field structure) in a LDMOS transistor serves to reduce the electric field at the front surface 12 of the semiconductor substrate 11 and to achieve an improved trade-off between a high breakdown voltage and low on-resistance.

The semiconductor substrate 11 has a bulk resistivity, ρ, which is greater than or equal to 100 Ohm·cm and may be described as highly resistive. In some embodiments, the semiconductor substrate 11 includes silicon and may include a silicon single crystal.

When the bulk resistivity of the semiconductor substrate is equal or greater than a predetermined level, the substrate related inductive and capacitive parasitics can be reduced. The desirable predetermined level is usefully equal or greater than 100 Ohm·cm resistivity, conveniently equal or greater than about 500 Ohm·cm resistivity, more conveniently equal or greater than about 1000 Ohm·cm resistivity. As used herein, the term "bulk resistivity" refers to those portions of substrate 60 that lie outside the device regions, e.g., outside of the doped regions of the LDMOS transistor and any associated RESURF structure.

The doped buried layer 16 of the RESURF structure 15 is provided to reduce the electric field at the front surface 12 of the semiconductor substrate 11 and, in particular, the electric field at the front surface 12 of the semiconductor substrate 11 at the drain-sided edge 28 of the gate 21 and in a region from the drain-sided edge 28 of the gate 21 in the direction of the drain region 20. The doped buried layer 16 may also be configured to be self-depleting and source grounded. The doped buried layer 16 serves to limit the drain to source leakage by making the drain junction less abrupt and assists in depleting the drift region during biasing of the drain junction.

As used herein, the term "LDMOS transistor" denotes a single LDMOS transistor structure including a source, a gate and a drain. A single LDMOS transistor structure may also be called a cell or a segment. The LDMOS transistor 14 includes a source region 19 which is highly doped with a second conductivity type, for example n+, and a drain region 20 which is highly doped with a second conductivity type, for example n+. The source region 19 and the drain region 20 are arranged at the front surface 12 of the semiconductor substrate 11 asymmetrically around a gate 21 arranged on the front surface 12.

A drift region 22 extends into the front surface 12 from the gate 21 in the direction of the drain region 20 and may be doped with the second conductivity type, for example n. The drift region 22 extends further into the semiconductor substrate 11 than the drain region 20. The drift region is doped with second conductivity type, for example n, and has a dopant concentration which is less than the dopant concentration of the drain region 20 and of the source region 19. The drift region 22 extends into the semiconductor substrate 11 by a greater distance than the channel region 17, but is spaced apart from the doped buried layer 16 by a portion of the semiconductor substrate 11.

The LDMOS transistor 14 further includes the channel region 17 which extends from the drift region 22 under the source region 19 and a body contact region 18 which is doped with the first conductivity type and extends from the front surface 12 into the semiconductor substrate 11 deeper than the channel region 17. The body contact region 18 is provided by a highly doped well of the second conductivity type which extends to and overlaps with the doped buried layer 16.

In some embodiments, the semiconductor substrate 11 may include silicon which is lightly doped with a first conductivity type, for example p−−. The buried doped layer 16 may be doped with the first conductivity type, for example p, the channel layer 17 may be doped with the first conductivity type, for example p, and the body contact region 18 may be highly doped with the first conductivity type, for example p+.

The LDMOS transistor 14 is one of a plurality of transistor cells or segments, whereby like electrodes of the transistor cells are electrically coupled together by a non-illustrated metallization structure arranged on the front surface 12 to form a single switching device. In a symmetric structure, the drain region 20 is provided around a centre line 23 and provides a common drain region 20 for two neighbouring transistor cells or segments. However, non-symmetric arrangements may also be used.

The drain region 20 has doping concentration usefully at least $5 \cdot 10^{19}$ cm$^{-3}$, conveniently at least $1 \cdot 10^{20}$ cm$^{-3}$ and more conveniently at least $3 \cdot 10^{20}$ cm$^{-3}$, but higher or lower doping concentrations may also be used. The drift regions 22 laterally abut the drain region 20 in a symmetric structure and have a doping concentration which is usefully in the range of $1 \cdot 10^{16}$ cm$^{-3}$ to $1 \cdot 10^{18}$ cm$^{-3}$, conveniently in the range of $7 \cdot 10^{16}$ cm$^{-3}$ to $3 \cdot 10^{17}$ cm$^{-3}$, and more conveniently in the range of $1 \cdot 10^{17}$ cm$^{-3}$ to $2 \cdot 10^{17}$ cm$^{-3}$, but higher or lower doping concentrations may also be used. Laterally outboard of drift regions 22 with respect to the centre line 23 are channel regions 17 underlying at least a portion of gate 21. The channel regions 17 have a doping concentration usefully in the range of $1 \cdot 10^{1}$ cm$^{-3}$ to $2 \cdot 10^{18}$ cm$^{-3}$, conveniently in the range of $3 \cdot 10^{17}$ cm$^{-3}$ to $1 \cdot 10^{18}$ cm$^{-3}$, and more conveniently in the range of $5 \cdot 10^{17}$ cm$^{-3}$ to $9 \cdot 10^{17}$ cm$^{-3}$, but higher or lower doping concentrations may also be used. Laterally outboard of channel regions 17 are source regions 19. Source regions 19 have doping concentration usefully of at least $5 \cdot 10^{19}$ cm$^{-3}$, conveniently of at least $1 \cdot 10^{20}$ cm$^{-3}$, and more conveniently of at least $3\cdot10^{20}$ cm$^{-3}$, but higher or lower doping concentrations may also be used. Laterally outboard of source regions 19 are the body contact regions 18. The body contact regions 18 have doping concentration usefully in the range of $1\cdot10^{18}$ cm$^{-3}$ to $1\cdot10^{20}$ cm$^{-3}$, conveniently in the range of $2\cdot10^{18}$ cm$^{-3}$ to $7\cdot10^{19}$ cm$^{-3}$, and more conveniently in the range of $5\cdot10^{18}$ cm$^{-3}$ to $5\cdot10^{19}$ cm$^{-3}$, but higher or lower doping concentrations may also be used. The substrate 11 may have a doping concentration in the range of $1\cdot10^{17}$ cm$^{-3}$ to $2\cdot10^{18}$ cm$^{-3}$. The doped buried layer may have a doping concentration in the range of $1\cdot10^{13}$ cm$^{-3}$ to $2\cdot10^{15}$ cm$^{-3}$.

When the gate 21 is appropriately biased, a conductive channel 17 forms between source region 19 and drain region 20. The exemplary conductivity types presented above are suitable for forming an N-channel structure, but persons of skill in the art will understand that a P-channel structure can also be formed by appropriate interchange of conductivity type of the various doped regions and appropriate modification of the bias on the gate 21.

The source region 19 of the LDMOS transistor 14 may be coupled to the rear surface 13 of the semiconductor substrate 11. The conductive path between the source region 19 and the rear surface 13 may have different forms.

In some embodiments, a conductive via is provided which extends from the front surface 12 to the rear surface 13 through the semiconductor substrate 11. The conductive via may be positioned such that the body contact 18 surrounds the upper portion of the conductive via. The conductive via may be lined with a metal, such as tungsten or copper. In some embodiments, the base of the conductive via is filled with high purity copper and the upper portion of the via includes high purity copper clad sidewalls which surround a gap. The top of the via may be sealed to provide a cavity or void within the upper portion of the through substrate via.

A contact structure including one or more metallic layers may extend substantially over the entire rear surface 13 of the semiconductor substrate 11. The contact structure on the rear surface 13 may be electrically coupled to the source region 19 in the opposing front surface 12 of the semiconductor substrate 11 by a conductive via, for example.

The doped buried layer 16, channel region 17, body contact region 18, drift region 22, source region 19 and drain region 20, may be formed by ion implantation through the front surface 12 of the semiconductor substrate 11 using appropriately structured masks and dopant ions and by subsequent diffusion of the implanted regions.

Figure 2:
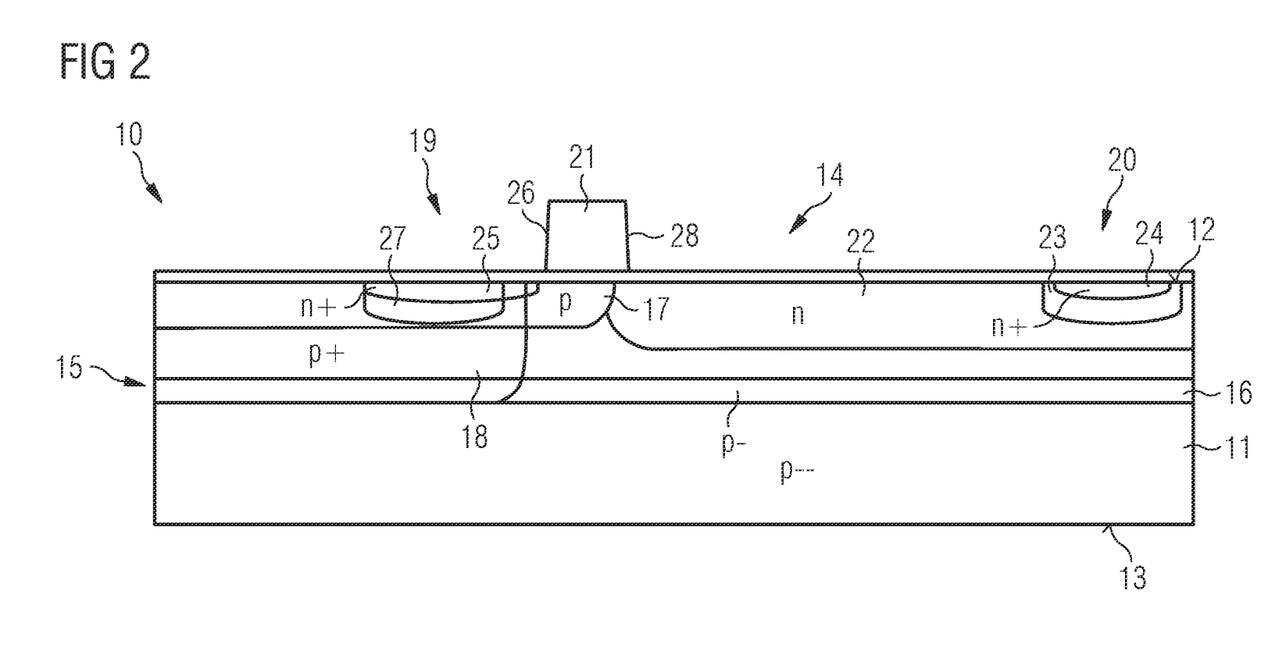
FIG. 2 illustrates a semiconductor device including a LDMOS transistor having a RESURF structure.

In some embodiments, such as the embodiment illustrated in FIG. 2, the source region 19 includes a double well structure and the drain region 20 includes a double well structure. A second well 23 of the drain 20 may surround a more highly doped well 24, whereby both wells are doped with the second conductivity type.

A more highly doped well 25 of the source region 19 may extend to the source side 26 of the gate 21 and extend outside of the lateral extent of the body contact region 18. A more lightly doped well 27 of the source region 19 extends further into the substrate 11 than the more highly doped well 25 and by a distance slightly less than that of the channel region 17 and may be positioned entirely within the body contact region 18. The remainder of the LDMOS transistor 14 and the RESURF structure 15 are the same as the embodiment illustrated in FIG. 1.

In the embodiments illustrated in FIGS. 1 and 2, the doped buried layer 16 of the RESURF structure 15 extends continuously through out the lateral area of the semiconductor substrate 11 and continuously under the source region 19, gate 21 and drain region 20 of the LDMOS transistor 14. The doped buried layer 16 is spaced apart from the drift region 22 and the channel region 17 by a portion of the semiconductor substrate 11. The doped buried layer 16 has a dopant concentration which is greater than the dopant concentration of the semiconductor substrate 11 and less than the dopant concentration of the channel region 17.

The RESURF structure 15 is provided to reduce the electric field at the front surface 12 of the semiconductor substrate 11 and, in particular, the electric field at the front surface 12 semiconductor substrate 11 at the drain-side edge 28 of the gate 21 and in the direction of the drain region 20. The RESURF structure 15 may be used to increase the breakdown voltage of the transistor whilst maintaining a low on-resistance.

The RESURF structure 15 may include further features to reduce electric field at the front surface 12 of the semiconductor substrate 11 in addition to the doped buried layer 16. In some embodiments, the RESURF structure includes at least one field plate. The field plate may extend from the gate 21 towards the drain region 20. The dimensions and position of the field plate the doped buried layer 16, doping level and profile of the doped buried layer 16 and the drift region 22 may be selected to produce electric field at the front surface 12 below a desired threshold value, for example 0.5 MV/cm.

Figure 3:
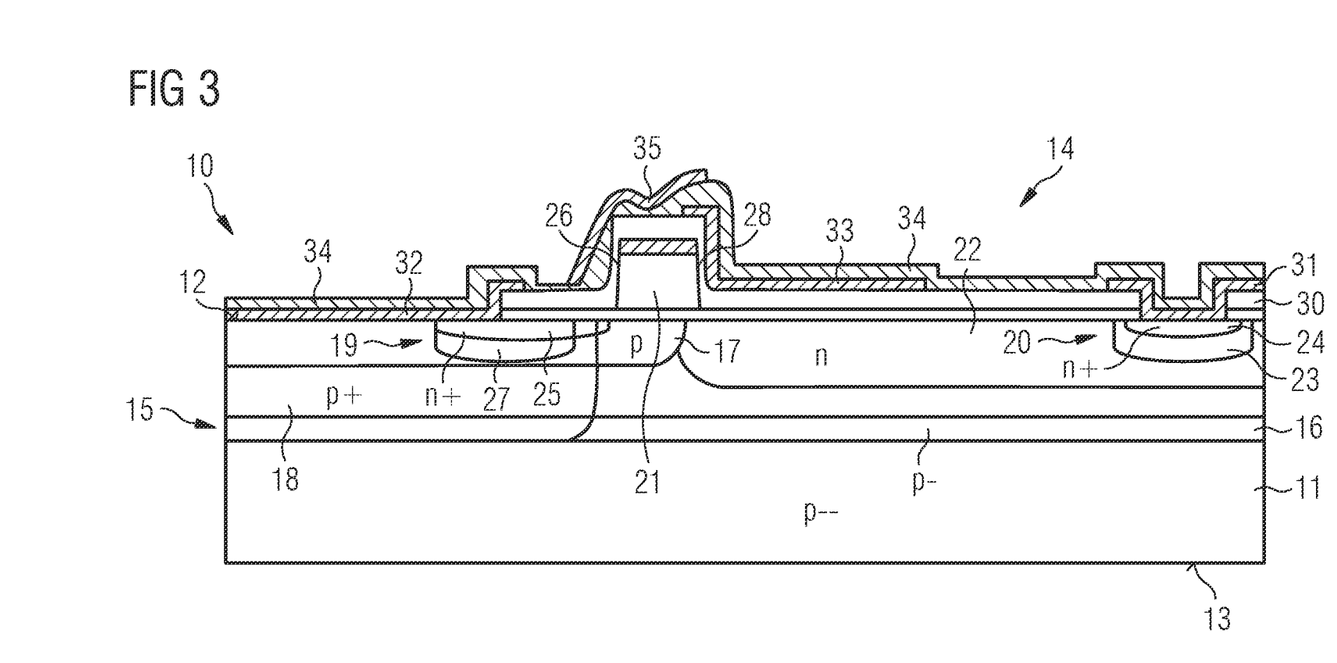
FIG. 3 illustrates a semiconductor device including a LDMOS transistor having a RESURF structure.

FIG. 3 illustrates the semiconductor device 10 with a RESURF structure 15 including the doped buried layer 16 and, additionally, a field plate 33. The semiconductor device 10 includes a first dielectric layer 30, for example a TEOS layer, on the front surface 12 of the semiconductor substrate 11. The first dielectric layer 30 is structured and has an opening above the drain contact region 23, in which a drain metal contact 31 is formed, and an opening over the source region 25, in which a source metal contact 32 is formed. The first dielectric layer 30 covers the gate 21 and extends between the source-sided gate edge 26 and the source metal contact 32 and between the drain-sided gate edge 28 and the drain metal contact 31.

The RESURF structure includes the field plate 33 which is positioned on the first dielectric layer 30 above the gate 21 which extends on the first dielectric layer 30 in the direction of the drain metal contact 31.

A second dielectric layer 34 is deposited such that it extends over the source metal contact 32, a portion of the first dielectric layer 30 positioned between the source metal contact 32 and the field plate 33, over the gate 21, over the field plate 33, a portion of the first dielectric layer 30 extending between field plate 33 and the drain metal contact 31 and over the drain metal contact 31. The second dielectric layer 34 may include two or more sublayers, for example, a first sublayer of silicon oxynitride (SiON) and a second sublayer of silicon dioxide ($SiO_2$) on the first sublayer.

The gate shield 35 is arranged on the second dielectric layer 34 above the gate 21 and extends in the direction of the source region 19. The gate shield 35 may be conformally deposited on the second dielectric layer 34 and may partially overlap the gate sided end of the field plate 33.

Figure 4:
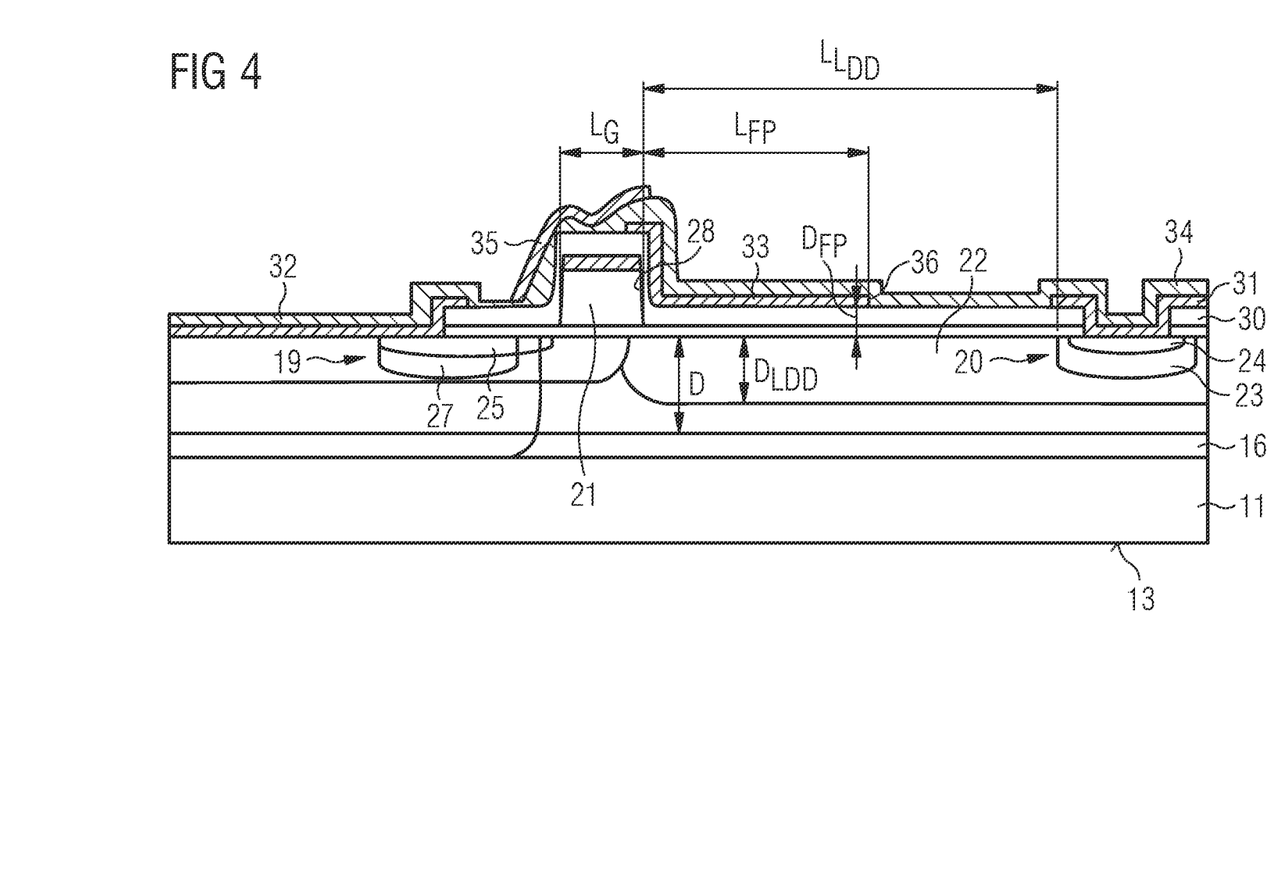
FIG. 4 illustrates a semiconductor device including a LDMOS transistor having a RESURF structure.

In this embodiment, the RESURF structure 15 includes the doped buried layer 16, the lightly doped drain region 22 and the field plate 33. FIG. 4 illustrates dimensions of the RESURF structure 15 and LDMOS transistor structure which may be optimised in order to reduce the electric field at the front surface 12, in particular at the drain sided edge 28 of the gate 21.

In order to reduce the electric field of a given transistor structure, such as that illustrated in FIG. 2, at the front surface 12 and in particular at the drain sided edge 28 of the gate 21, the length of the field plate between drain sided edge 28 of the gate 21 and the drain-sided edge 36 of the field plate 33, $L_{FP}$, the length of the gate 21, $L_G$, the length of the drift zone between the drain-sided edge 28 of the gate 21 and the gate sided edge 37 of the drain metal contact 31, $L_{LDD}$, the height of the field plate above the drift zone, $D_{FP}$, the depth of the drift zone, $D_{LDD}$, from the front surface 12 and the depth of the doped buried layer 16, D, from the front surface 12 may be suitably selected and optimised.

Suitable dimensions of the transistor structure may differ depending on the voltage class of the transistor device. For a voltage class of 28V to 30 V, the length $L_{FP}$ may lie in the range of 0.8 µm to 1.2 µm, the length $L_G$ may lie in the range of 0.2 µm to 0.5 µm, the length $L_{LDD}$ may lie in the range of 2.5 µm to 3.2 µm, the height $D_{FP}$ may lie in the range of 0.1 µm to 0.2 µm, the depth $D_{LDD}$ may lie in the range of 0.1 µm to 0.5 µm and the depth of the doped buried layer, D, may lie in the range of 0.5 µm to 2.5 µm.

For a voltage class of 18V, the length $L_{FP}$ may lie in the range of 0.4 µm to 1.0 µm, the length $L_G$ may lie in the range of 0.15 µm to 0.3 µm, the length $L_{LDD}$ may lie in the range of 0.8 µm to 2.5 µm, the height $D_{FP}$ may lie in the range of 0.05 µm to 0.15 µm, the depth $D_{LDD}$ may lie in the range of 0.1 µm to 0.5 µm and the depth of the doped buried layer, D, may lie in the range of 0.3 µm to 2.0 µm.

For a voltage class of 50V, the length $L_{FP}$ may lie in the range of 0.8 µm to 2.0 µm, the length $L_G$ may lie in the range of 0.3 µm to 0.8 µm, the length $L_{LDD}$ may lie in the range of 3.0 µm to 8.0 µm, the height $D_{FP}$ may lie in the range of 0.15 µm to 0.35 µm, the depth $D_{LDD}$ may lie in the range of 0.1 µm to 1.0 µm and the depth of the doped buried layer, D, may lie in the range of 0.5 µm to 3.0 µm.

Figure 5:
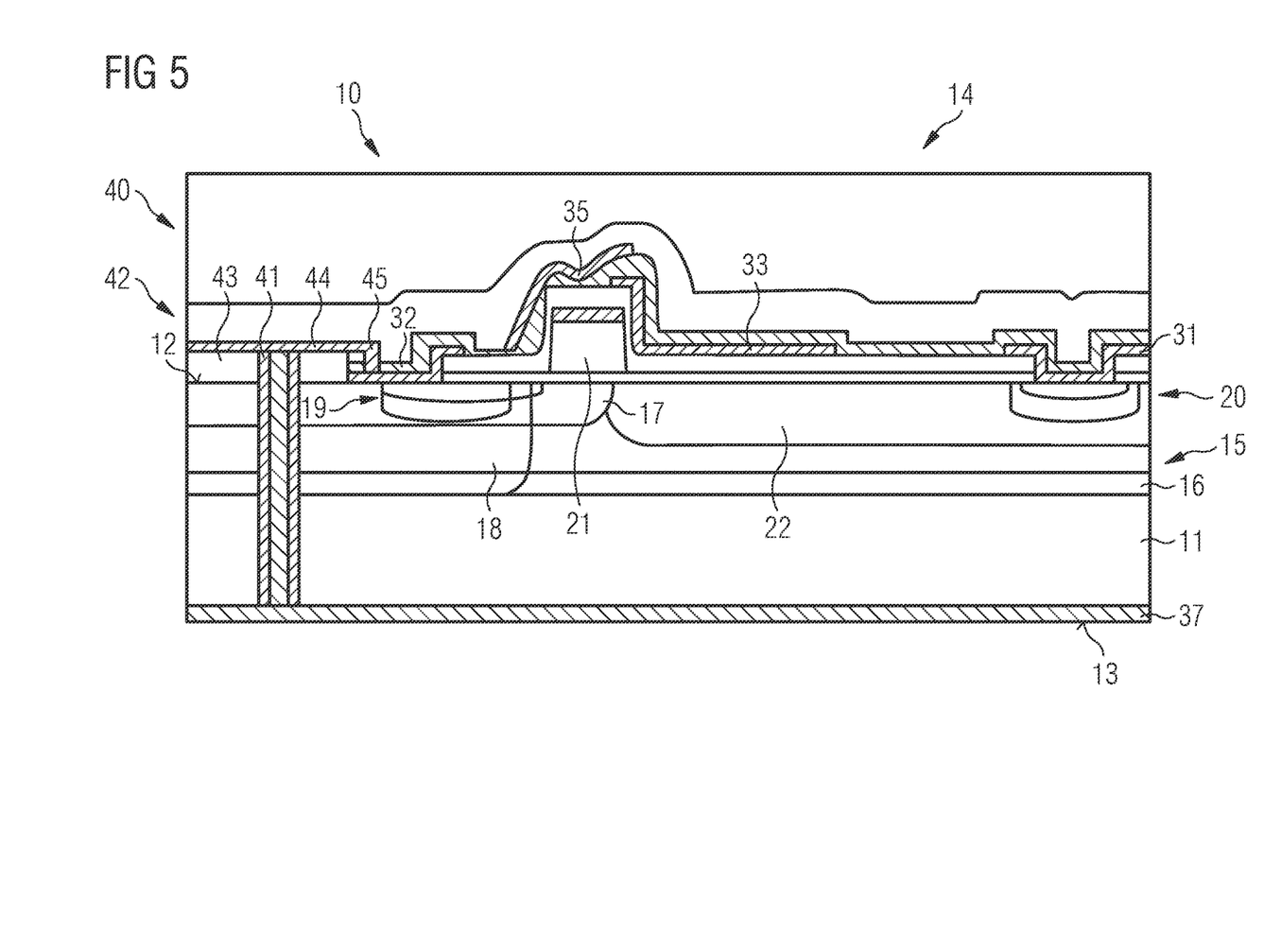
FIG. 5 illustrates a semiconductor device including a LDMOS transistor having a RESURF structure.
Figure 6:
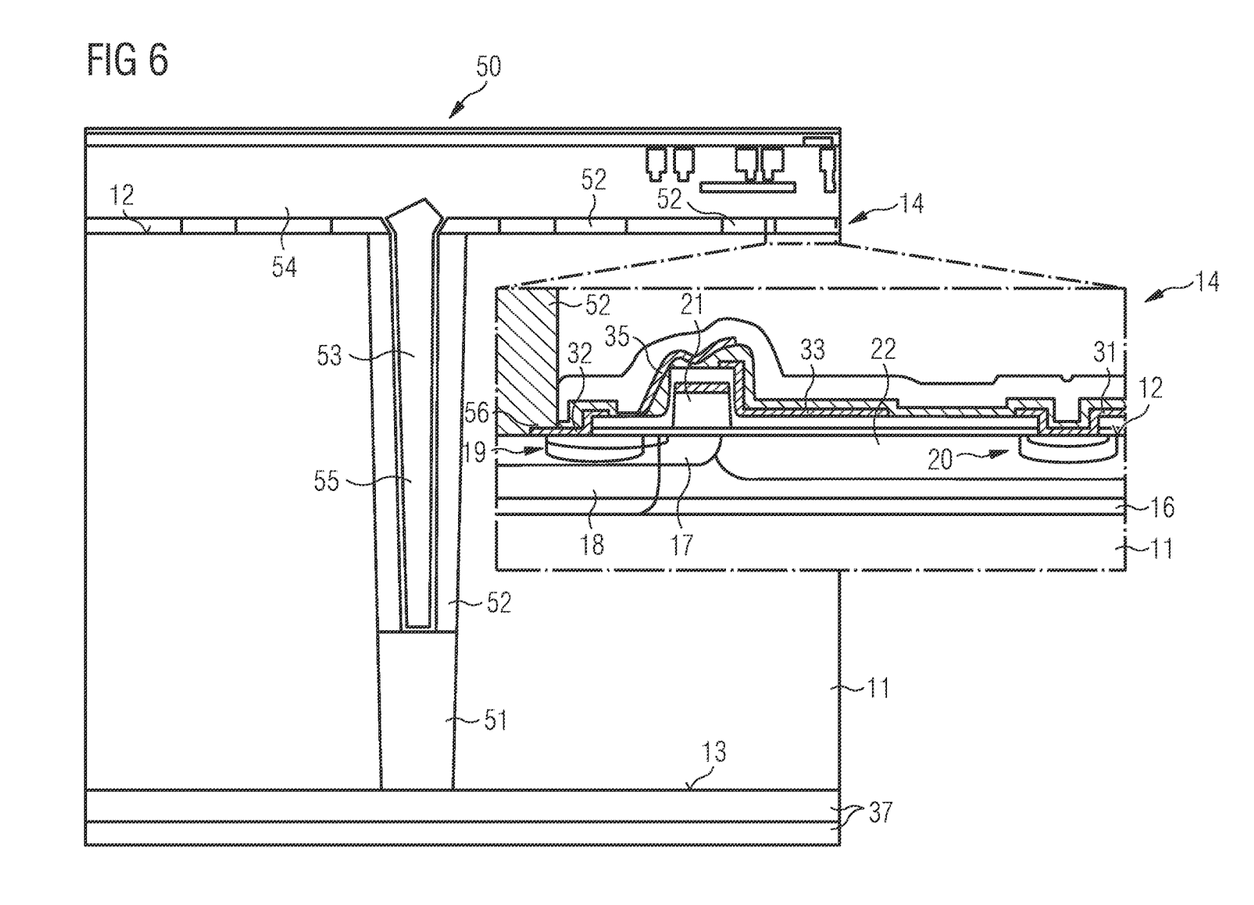
FIG. 6 illustrates a semiconductor device including a LDMOS transistor having a RESURF structure.

The semiconductor device may exhibit a breakdown voltage of at least 60 volts while supporting a saturation current of at least 0.15 A/mm The source region 19 may be coupled to the rear surface 13 of the semiconductor substrate 11 and, in particular, to a conductive layer 37 arranged on the rear surface 13. The conductive layer 37 may provide a contact pad for mounting the semiconductor device 10 onto a substrate and/or a ground plane of a package. In some embodiments, the connection between the source region 19 and the rear surface 13 of the semiconductor substrate 11 is provided by a conductive path positioned at least partly within the semiconductor substrate 11. FIGS. 5 and 6 illustrate examples of conductive paths which may be used.

FIG. 5 illustrates an embodiment in which a through substrate via (TSV) 40 is provided which extends from the front surface 12 to the rear surface 13 of the semiconductor substrate 11. The TSV 40 may include a conductive material 41, such as tungsten, which fills the TSV 40. The TSV 40 may include an outermost dielectric lining to electrically insulate the conductive path positioned within the TSV 40 from the doped regions of the semiconductor substrate 11. One or more liner layers providing adhesion promotion, a diffusion barrier and/or a seed layer arranged between the material of the semiconductor substrate 11 defining the side walls of the TSV 40 and the conductive material 41. The conductive material 41 may be electrically coupled to the source region 19 by a portion of a metallisation structure 42 arranged on the front surface 12 of the substrate 11. The TSV 40 extends through a dielectric layer 43 arranged on the front surface 12 and is coupled to metallic layer 44 arranged on the dielectric layer 43 which in turn is coupled to the source region 19 by a further conductive via 45 which extends through the dielectric layer 43 to the source metal contact 32. The metallic layer 44 may include aluminium.

FIG. 6 illustrates a structure for a through substrate via (TSV) 50 according to a further embodiment, which extends from the front surface 12 to the rear surface 13 of the semiconductor substrate 11. The insert illustrates an enlarged view of the LDMOS transistor 14 and the electrical connection to the TSV 50.

The TSV 50 includes a first conductive portion 51 at its base including conductive material such as high purity copper. At the base, the conductive material fills the volume of the TSV 50 and forms a portion of the rear surface 13 such that it is in direct contact with the conductive layer 37 positioned on the rear surface 13 of the semiconductor substrate 11. The TSV 50 further includes a conformal conductive layer 52 which is arranged on the side walls of the via and at least on the periphery of the upper surface of the conductive portion 51 at the base of the via. The conformal conductive layer 52 may also include high purity copper. The conductive layer 52 may define a gap 53 within the upper portion of the TSV 50 which may be sealed at the top, for example by a conductive layer or a semiconductor layer or a dielectric layer 54, to form a void 55 within the upper portion of the TSV 50.

An upper region of the TSV 50 is surrounded by the body contact region 17. The TSV 50 may be one of a plurality of TSVs which are arranged in a row or array in regions of the substrate between neighbouring LDMOS transistors. The TSV or TSVs may be coupled to the source region of the two neighbouring LDMOS transistors.

The conformal conductive layer 52 may also extend over the front surface 12 of the semiconductor substrate 11 and may be directly arranged on, and electrically coupled with, a conductive layer 56 coupled to the source metal contact 32 at a position adjacent to the source region 19.

One or more further layers may be arranged on the walls of the TSV 50 acting as an adhesion promotion layers, a diffusion barrier and/or seed layer, for example, Ti, TiN and a Cu seed layer may be deposited using Physical Vapour Deposition and/or Chemical Vapour Deposition techniques and the first portion 51 and the conformal conductive layer 52 by electro-deposition techniques.

In this embodiment, the conformal conductive layer 52 may be formed using dual damascene techniques. The conformal conductive layer 52 and the conductive portion 51 may be formed using electroplating techniques. For example, the conditions used to electrodeposit first conductive portion 51 may be different to those used to electrodeposit the conformal conductive layer 52 on top of the first conductive portion 51.

The first conductive portion 51 and the conformal conductive layer 52 may have different microstructures, for example different average grain sizes.

Figure 7:
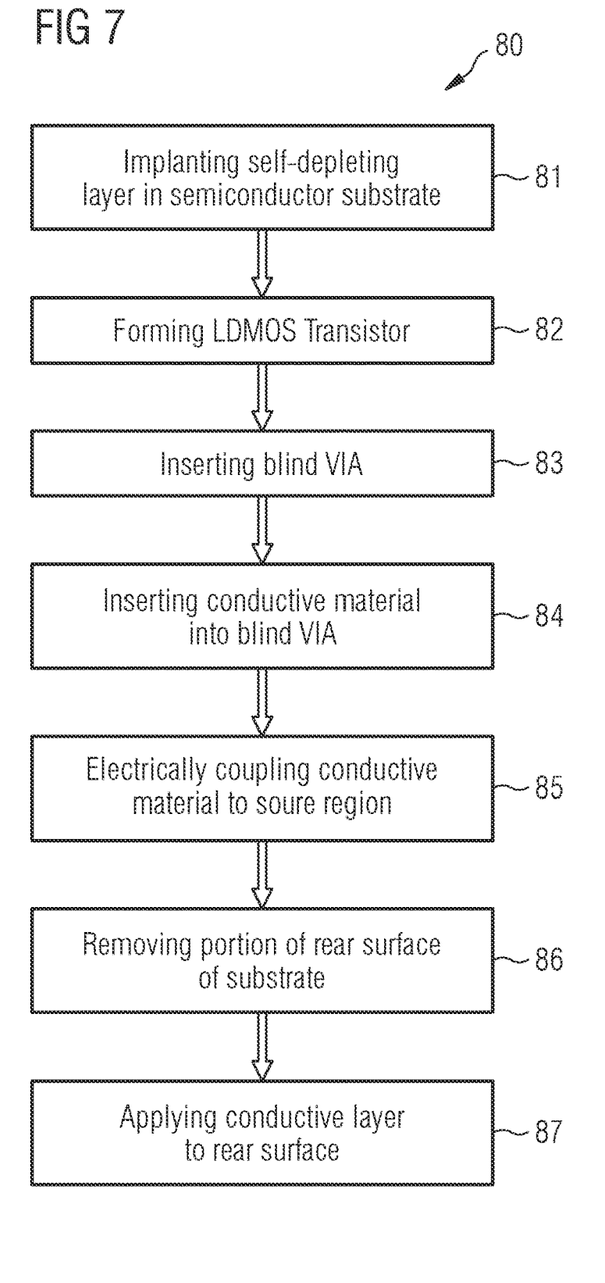
FIG. 7 illustrates a flow diagram of a method for fabricating a LDMOS transistor having a RESURF structure.

FIG. 7 illustrates a flow diagram 80 of a method for fabricating a LDMOS transistor with a RESURF structure including a doped buried layer according to one or more of the embodiments described herein.

In block 81, the method includes implanting a self-depleting layer with a dopant concentration of a first conductivity type within a semiconductor substrate having a bulk resistivity $\rho \geq 100$ Ohm·cm and, in block 82, forming an LDMOS transistor in a front surface of the substrate, such that a source region, a channel region, a drift region and a drain region are spaced apart from the self-depleting layer by a portion of the substrate and the body contact region extends to and is coupled with the self-depleting layer.

The self-depleting layer may be implanted such that it extends continuously throughout the lateral area of the substrate. The substrate, the channel layer and the self-depleting layer are doped with a first conductivity type such that the dopant concentration of the self-depleting layer is greater than a dopant concentration of the substrate and less than a doping concentration of the channel region. The body contact region is doped with the first conductivity type and has a dopant concentration greater than the dopant concentration of the channel region. The channel layer and the body contact region may be formed by implantation from the front surface and subsequent diffusion. The drift region may be formed by implantation from the front surface and subsequent diffusion.

The source region, the drift region and the drain region have a dopant concentration of a second conductivity type, which opposes the first conductivity type. The source region and the drain region are more highly doped than the drift region. The source region, the drift region and the drain region may also be formed by implantation from the front surface.

After formation of the LDMOS transistor, the method may further progress to block 83 and include inserting a blind or closed end via into the front surface of the substrate such that the body contact region surrounds the via, in block 84, inserting conductive material into the blind via, and in block 85 electrically coupling the conductive material to the source region.

In some embodiments, the inserting conductive material into the via includes inserting conductive material into the via and forming a first portion at the base of the via which fills the via and inserting conductive material into an upper portion of the via which lines side walls of the via so as to surround a gap. The method may further progress to block 86 and include removing a portion of the rear surface of the substrate to expose the conductive material within the via at the rear surface and, in block 87, applying a conductive layer to the rear surface and the conductive material.

One or more semiconductor devices including one or more LDMOS transistors according to any one of the embodiments described herein may be used in a high frequency power amplifying circuit, such as RF power amplifying circuits for use in cellular communications operating at frequencies in the range of 700 MHz to 3.6 GHz, power conversion in cellular communication networks and Doherty configuration amplifying circuits.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
    a semiconductor substrate having a bulk resistivity $\rho \geq 100$ Ohm·cm, a front surface and a rear surface;
    an LDMOS (Lateral Diffused Metal Oxide Semiconductor) transistor in the semiconductor substrate; and
    a RESURF (REduced SURface Field structure) structure comprising a doped buried layer arranged in the semiconductor substrate,
    wherein a source region of the LDMOS transistor comprises a first well and a second well having the same conductivity type,
    wherein the first well is more highly doped than the second well,
    wherein the first well extends to a source side of a gate of the LDMOS transistor and outside of the lateral extent of a body contact region of the LDMOS transistor,
    wherein the second well extends further into the substrate than the first well by a distance less than that of a channel region of the LDMOS transistor and is positioned entirely within the body contact region.

2. The semiconductor device of claim 1, wherein the doped buried layer is spaced at a distance from the front surface and the rear surface, and coupled with at least one of the channel region and the body contact region of the LDMOS transistor, and the RESURF structure further comprises:
    a lightly doped region extending from the gate towards a drain region of the LDMOS transistor; and
    at least one field plate.

3. The semiconductor device of claim 1, wherein the RESURF structure is dimensioned such that an electric field at the front surface in a region between the gate and a drain region of the LDMOS transistor is less than 0.5 MV/cm.

4. The semiconductor device of claim 1, wherein the doped buried layer extends continuously throughout a lateral area of the semiconductor substrate.

5. The semiconductor device of claim 1, wherein the doped buried layer extends continuously under the source region, the gate and a drain region of the LDMOS transistor.

6. The semiconductor device of claim 1, further comprising a first dielectric layer on the front surface of the substrate having an opening above a drain region of the LDMOS transistor in which a drain metal contact is formed and an opening over the source region of the LDMOS transistor in which a source metal contact is formed.

7. The semiconductor device of claim 6, wherein the first dielectric layer covers the gate of the LDMOS transistor and extends between a source-sided gate edge and the source metal contact and between a drain-sided gate edge and the drain metal contact.

8. The semiconductor device of claim 7, wherein a field plate is positioned on the first dielectric layer above the gate and extends on the first dielectric layer in the direction of the drain metal contact.

9. The semiconductor device of claim 8, further comprising a second dielectric layer that extends over the source metal contact, over a portion of the first dielectric layer positioned between the source metal contact and the field plate, over the gate, over the field plate, over a portion of the first dielectric layer extending between the field plate and the drain metal contact, and over the drain metal contact.

10. The semiconductor device of claim 9, further comprising a gate shield arranged on the second dielectric layer above the gate and extending in the direction of the source region.

11. The semiconductor device of claim 10, wherein the gate shield is conformally deposited on the second dielectric layer and partially overlaps a gate-sided end of the field plate.

12. The semiconductor device of claim 1, further comprising a conductive via extending from the front surface to the rear surface of the substrate, wherein the conductive via includes a first conductive portion adjacent the rear surface which fills the via and a second conductive portion arranged on the first portion which lines side walls of the via and surrounds a gap, wherein the gap is sealed at the top to form a void within the upper portion of the conductive via.

13. The semiconductor device of claim 12, wherein the second conductor portion extends over the front surface of the substrate and is arranged directly on and electrically coupled with a conductive layer coupled to a source metal contact at a position adjacent the source region of the LDMOS transistor.

14. A high frequency amplifying circuit comprising the semiconductor device of claim 1.

15. The high frequency amplifying circuit of claim 14, wherein the high frequency amplifying circuit comprises an RF power amplifying circuit configured for use in cellular communications operating at frequencies in the range of 700 MHz to 3.6 GHz.

16. The high frequency amplifying circuit of claim 14, wherein the high frequency amplifying circuit comprises an RF power amplifying circuit configured for use in power conversion in cellular communication networks.

17. The high frequency amplifying circuit of claim 14, wherein the high frequency amplifying circuit comprises an RF power amplifying circuit configured for use in Doherty configuration amplifying circuits.

18. A semiconductor device, comprising:
a semiconductor substrate having a bulk resistivity ρ≥100 Ohm·cm, a front surface and a rear surface;
an LDMOS (Lateral Diffused Metal Oxide Semiconductor) transistor in the semiconductor substrate;
a RESURF (REduced SURface Field structure) structure comprising a doped buried layer arranged in the semiconductor substrate;
a first dielectric layer on the front surface of the substrate having an opening above a drain region of the LDMOS transistor in which a drain metal contact is formed and an opening over a source region of the LDMOS transistor in which a source metal contact is formed, the first dielectric layer covering a gate of the LDMOS transistor and extending between a source-sided gate edge and the source metal contact and between a drain-sided gate edge and the drain metal contact;
a field plate positioned on the first dielectric layer above the gate and that extends on the first dielectric layer in the direction of the drain metal contact; and
a second dielectric layer that extends over the source metal contact, over a portion of the first dielectric layer positioned between the source metal contact and the field plate, over the gate, over the field plate, over a portion of the first dielectric layer extending between the field plate and the drain metal contact, and over the drain metal contact.

19. The semiconductor device of claim 18, further comprising a gate shield arranged on the second dielectric layer above the gate and extending in the direction of the source region.

20. The semiconductor device of claim 19, wherein the gate shield is conformally deposited on the second dielectric layer and partially overlaps a gate-sided end of the field plate.

21. A high frequency amplifying circuit comprising the semiconductor device of claim 18.

22. The high frequency amplifying circuit of claim 21, wherein the high frequency amplifying circuit comprises an RF power amplifying circuit configured for use in cellular communications operating at frequencies in the range of 700 MHz to 3.6 GHz.

23. The high frequency amplifying circuit of claim 21, wherein the high frequency amplifying circuit comprises an RF power amplifying circuit configured for use in power conversion in cellular communication networks.

24. The high frequency amplifying circuit of claim 21, wherein the high frequency amplifying circuit comprises an RF power amplifying circuit configured for use in Doherty configuration amplifying circuits.

25. A semiconductor device, comprising:
a semiconductor substrate having a bulk resistivity ρ≥100 Ohm·cm, a front surface and a rear surface;
an LDMOS (Lateral Diffused Metal Oxide Semiconductor) transistor in the semiconductor substrate; and
a RESURF (REduced SURface Field structure) structure comprising a doped buried layer arranged in the semiconductor substrate,
wherein the doped buried layer of the RESURF structure has a same conductivity type as a channel region and/or a body contact region of the LDMOS transistor,
wherein the doped buried layer of the RESURF structure is coupled with at least one of the channel region and the body contact region of the LDMOS transistor,
wherein the doped buried layer of the RESURF structure is spaced apart from the channel region and a drift region of the LDMOS transistor by a portion of the semiconductor substrate.

* * * * *